US006417724B1

(12) United States Patent
Taylor

(10) Patent No.: US 6,417,724 B1
(45) Date of Patent: Jul. 9, 2002

(54) FOLDED PTAT CURRENT SOURCING

(75) Inventor: Clive Roland Taylor, Hertfordshire (GB)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

(21) Appl. No.: 09/747,121

(22) Filed: Dec. 22, 2000

(51) Int. Cl.[7] .................................................. H01L 35/00

(52) U.S. Cl. ......................................... 327/538; 327/512

(58) Field of Search ................................. 323/312, 313, 323/314, 315, 316; 327/378, 512, 513, 530, 534, 535, 538, 539, 540, 541, 542, 543

(56) References Cited

U.S. PATENT DOCUMENTS 5,448,158 A * 9/1995 Ryat ........................... 323/312
5,936,392 A * 8/1999 Taylor ........................ 323/315

OTHER PUBLICATIONS

Liu, Tao; Xu, Zhi–Wei; and Cheng, Jun–Xia, A Simple CMOS Bandgap Voltage Reference with High PSRR, Microelectronics No. 2, vol. 29, 1999.

* cited by examiner

*Primary Examiner*—Jeffrey Zweizig

(57) ABSTRACT

The reliability and operability of semiconductor devices is improved using a current source that advantageously exhibits stability during startup, operates at low voltages and can be used with a variety of integrated circuit devices including operational amplifiers. An example embodiment of the present invention is directed to a PTAT current sourcing circuit that includes first and second current paths and a folded current-drawing arrangement in which first and second bipolar transistors provide a substantially-reduced minimum operating voltage. In a more particular example embodiment, the PTAT current sourcing circuit comprises a first current path including a pair of cascoded MOS-type transistors inter-coupled at a first node, and including another MOS-type circuit in series with the pair of cascoded MOS-type transistors. A second current path, in parallel with the first current path, includes a pair of cascoded MOS-type transistors inter-coupled at a second node, and includes another MOS-type circuit in series with the pair of cascoded MOS-type transistors in the second current path. The first and second current paths are adapted to include feedback and to form a current loop. The circuit further comprises first and second bipolar transistors that respectively draw current from the first and second current paths at the first and second nodes. The first bipolar transistor draws current through a resistive path adapted to subtract current from the first current path.

20 Claims, 3 Drawing Sheets

FOLDED PTAT CURRENT SOURCING

FIELD OF THE INVENTION

The present device relates generally to semiconductor devices and, more particularly, to semiconductor devices and their manufacture involving a proportional-to-absolute temperature (PTAT) current source in the device.

BACKGROUND OF THE INVENTION

In recent years, the semiconductor industry has realized tremendous advances in technology that have permitted dramatic increases in circuit density and complexity, and equally dramatic decreases in power consumption and package sizes. Present semiconductor technology permits single-chip microprocessors with many millions of transistors, operating at speeds of hundreds of MIPS (millions of instructions per second) to be packaged in relatively small, semiconductor device packages.

A problem with packaging these high-density circuits in relatively small, semiconductor device packages is a significant increase in ambient temperatures due to the power dissipation associated with the density and operational speed of the circuits. In an effort to control this overall increase in temperature, many such semiconductor circuits are air-cooled and include alarms and shut-back circuits for temperatures increasing beyond specified operating conditions. Unfortunately, as the complexity of integrated circuits has increased, the demand for highly functional and reliable power sources for use in various applications has also increased, and the more complex circuits require internal temperature controls to ensure proper operation.

In an attempt to address this temperature issue, it is often necessary to provide a local reference voltage of a known value that remains stable with both temperature and process variations. A common solution is a bandgap reference circuit. A bandgap reference circuit provides stable, precise and continuous output reference voltages for use in various analog circuits. Recently, it has become necessary for many commercial integrated circuits to operate at less than the conventional five-volt power supply voltage, such as three volts. As a result, bandgap reference voltage circuits must operate over a power supply range from over five volts down to three volts and less. The output reference voltage provided by known bandgap reference circuits, however, typically varies somewhat with respect to one or more of factors, such as temperature and manufacturing processes. Moreover, some known bandgap reference circuits fail to function when the power supply voltage is lowered to three volts.

One method of providing a voltage reference is to provide a stable reference current through the base-emitter voltage Vbe of a forward-biased bipolar transistor, which provides a fairly linear function of absolute temperature T in degrees Kelvin. When using a bandgap reference, the reference voltage is obtained by compensating the base-emitter voltage of a bipolar transistor Vbe for its temperature dependence (which is inversely proportional to temperature) using a proportional-to-absolute temperature (PTAT) voltage. The difference between the base-emitter voltages Vbe1 and Vbe2 of two transistors, referred to as ΔVbe, that are operated at a constant ratio between their emitter-current densities forms the PTAT voltage. The emitter-current density is conventionally defined as the ratio of the collector current to the emitter size. Because the two silicon junctions are operated at different current densities (J1, J2), the differential voltage, ΔVbe, is a predictable, accurate and linear function of temperature.

Reference circuits of this type are present in many applications ranging from purely analog, mixed-mode, to purely digital circuits. The demand for low voltage references is especially apparent in mobile battery operated products, such as cellular phones, pagers, camera recorders, and laptops. Consequently, low voltage and low quiescent current flow are intrinsic and required characteristics conducive toward increased battery efficiency and longevity. Low voltage operation is also a consequence of process technology. This is because isolation barriers decrease as the component densities per unit area increase thereby exhibiting lower breakdown voltages. Unfortunately, due to increased demands in operating voltage levels, lower dynamic range will be required which, in turn, necessitates that reference voltages be more accurate.

In view of the above demands, PTAT circuits are often used to provide differential current to such semiconductor circuits. PTAT current sources are often limited, however, and can exhibit operational discrepancies at various states, such as during startup of an integrated circuit device. PTAT current sources are particularly limited in applications for oscillator circuits. In such situations, the presence of an operational amplifier that can include a negative feedback mode that can conflict with the function of the current source. In some implementations, the conflict can cause incorrect frequency at startup, which can seriously hinder the functionality of the integrated circuit device in which the current source is being used. PTAT sources can also exhibit ripple effects that distort or otherwise adversely affect the output of the source and the circuit being powered. These and other difficulties associated with PTAT current sources have been a hindrance to the advancement of the semiconductor industry.

A further issue is the financial constraint that these circuits be implemented using relatively simple processes, such as standard CMOS, bipolar, and BICMOS technologies. Thus, when attempting to address the above-mentioned problems, it is helpful to use circuitry that does not burden the semiconductor manufacturing processes.

SUMMARY OF THE INVENTION

The present invention improves the application of PTAT current sources to semiconductor devices including those applications addressed above. The present invention is exemplified in a number of implementations and applications, some of which are summarized below. Advantageously, the reliability and operability of semiconductor devices can be improved using a current source, according to the present invention, that exhibits stability during startup, operates at low voltages and can be applied in connection with operational amplifiers. An example embodiment of the present invention is directed to a PTAT current sourcing circuit that includes first and second current paths and a folded current-drawing arrangement in which first and second bipolar transistors provide a substantially-reduced minimum operating voltage. In a more particular embodiment, the PTAT current sourcing circuit comprises a first current path including a pair of cascoded MOS-type transistors inter-coupled at a first node, and including another MOS-type circuit in series with the pair of cascoded MOS-type transistors. A second current path, in parallel with the first current path, includes a pair of cascoded MOS-type transistors inter-coupled at a second node, and includes another MOS-type circuit in series with the pair of cascoded MOS-type transistors in the second current path. The first and second current paths are adapted to include feedback and to form a current loop.

Another aspect of the present invention is directed to a PTAT current source circuit, such as described above, and further includes a circuit for mirroring the current flowing in the main resistive path.

Yet another aspect of the present invention is directed to a PTAT current source circuit including a circuit having a bandgap reference voltage that is controlled by the feedback of the first and second current paths.

The above summary is not intended to describe each illustrated embodiment or every implementation of the present invention. For example, other aspects of the invention are directed to methods and systems employing one or more of the above features. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
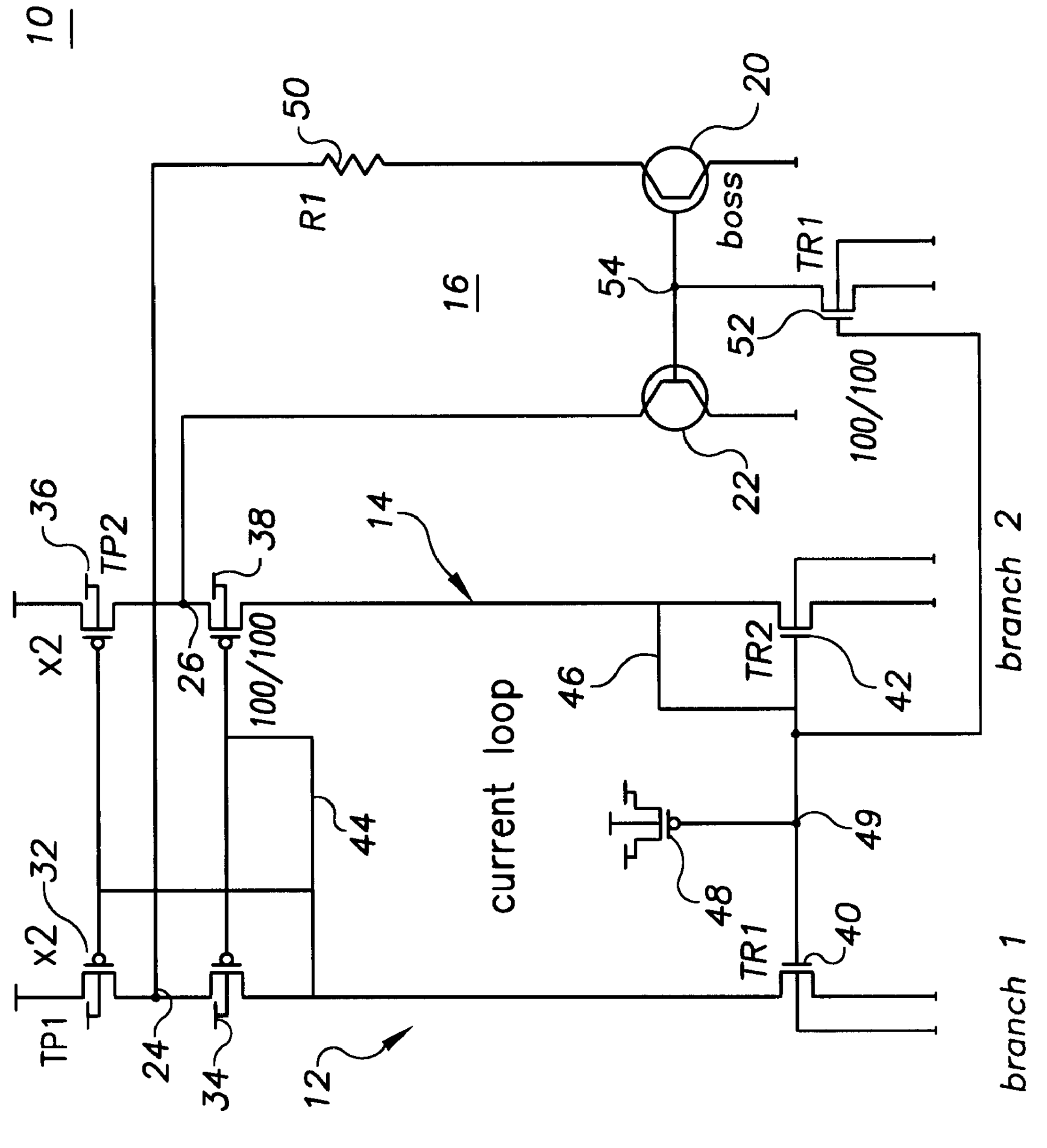
FIG. 1 is a diagram of a PTAT current source circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for use in connection with devices that benefit from the use of PTAT current sources. While the present invention is not limited to such devices, an appreciation of various aspects of the invention is best gained through a discussion of various examples using this application.

FIG. 1 illustrates a folded PTAT current source circuit 10, according to an example embodiment of the present invention. The circuit 10 includes first and second current paths 12 and 14, and a folded current-drawing circuit 16 in which first and second bipolar transistors 20 and 22 draw current from respective first and second nodes 24 and 26. In this example embodiment, the bipolar transistors 20 and 22 are PNP transistors. At the node 24, the first current path 12 includes a pair of cascoded PMOS transistors 32 and 34, while at the node 26, the second current path 14 includes a pair of cascoded PMOS transistors 36 and 38. The first and second current paths 12 and 14 also respectively include NMOS circuits 40 and 42 in series with the cascoded MOS-type transistors. Preferably, the transistors 32/36 are precisely matched to one another, and the transistors 40/42 are precisely matched to one another; it is also helpful to match the transistors 34/38 and the transistors 20/22.

Feedback paths are provided from the current source output branches, via connections 44 and 46, to the common gates of the cascoded MOS transistors and to the gate of the NMOS transistor 42. The current source output branches and the feedback connections 44 and 46 form a current loop. A capacitor 48 is used to stabilize the voltage at node 49 that interconnects NMOS transistors 40 and 42.

The current loop is prevented from escalating in a positive mode by a resistor 50 that is in the path through which current is drawn from the node 24 to the bipolar transistor 20. The cascoded MOS-type transistors act to isolate the nodes 24 and 26 from producing voltage variations and, in this manner, provide a relatively "pure-current" source at the nodes 24 and 26. When feedback causes the gate-source voltage at the MOS transistor 40 to increase, the current drawn from this first current path 12 will also increase, thereby resulting in an increased voltage across the resistor 50. The increased voltage drop across the resistor 50 causes current to be subtracted from the total branch current rather than added as would occur in a typical PTAT current source that is not folded. In this context, the term "folded " relates to the concept of "folded" operational amplifiers.

Another important feature of the circuit 10 of FIG. 1 involves the feedback provided from the node 49 for correcting the voltage provided to bipolar transistors 20 and 22, at node 54, and to permit the nodes 24 and 26 to find their correct operating voltages. Using an isolation circuit, for example, NMOS transistor 52, the voltage referenced at the lower end of the resistor 50 can be directed appropriately according to the current loop.

Figure 2:
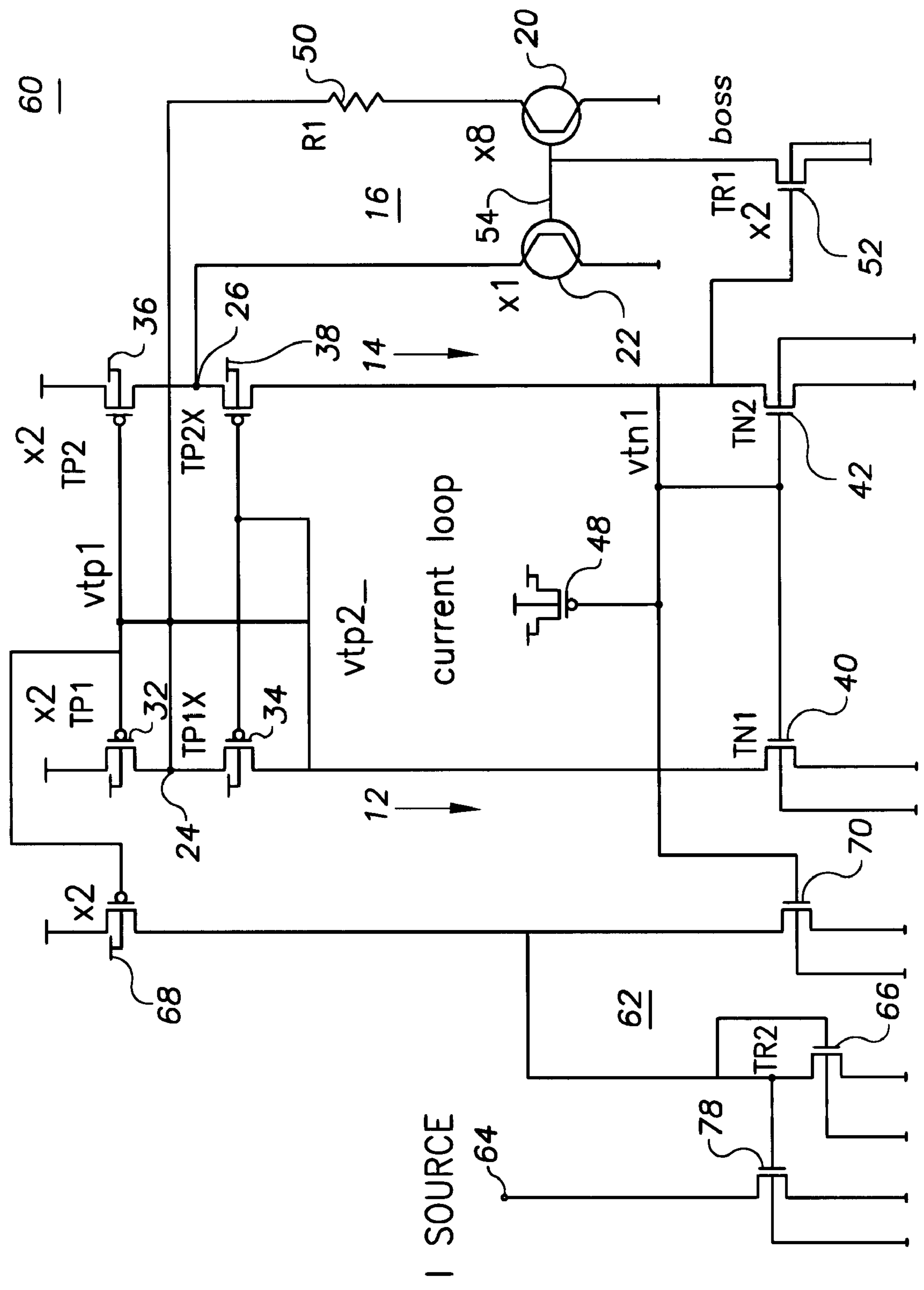
FIG. 2 is a modified diagram of the PTAT current source circuit of FIG. 1, wherein the current flowing in the main resistive path of FIG. 1 is mirrored, according to another example embodiment of the present invention.

FIG. 2 is a modified diagram of the PTAT current source circuit of FIG. 1, according to another example embodiment of the present invention. In FIG. 2, the PTAT current source circuit 60 includes circuit 62 having a current-source output node 64 that mirrors the current flowing in the main resistive path. The current difference between the transistors 32/36 and 40/42, which form the current loop, flows across NMOS transistor 66. Also included in the circuit 62 are MOS-type transistors 68 and 70 which are coupled to the current paths 12 and 14 and adapted to present the current difference between the transistors 32/36 and 40/42 to the drain of NMOS transistor 66. The drain of NMOS transistor 66 is then coupled to transistor 78 that provides the current at the current-source output node 64.

Figure 3:
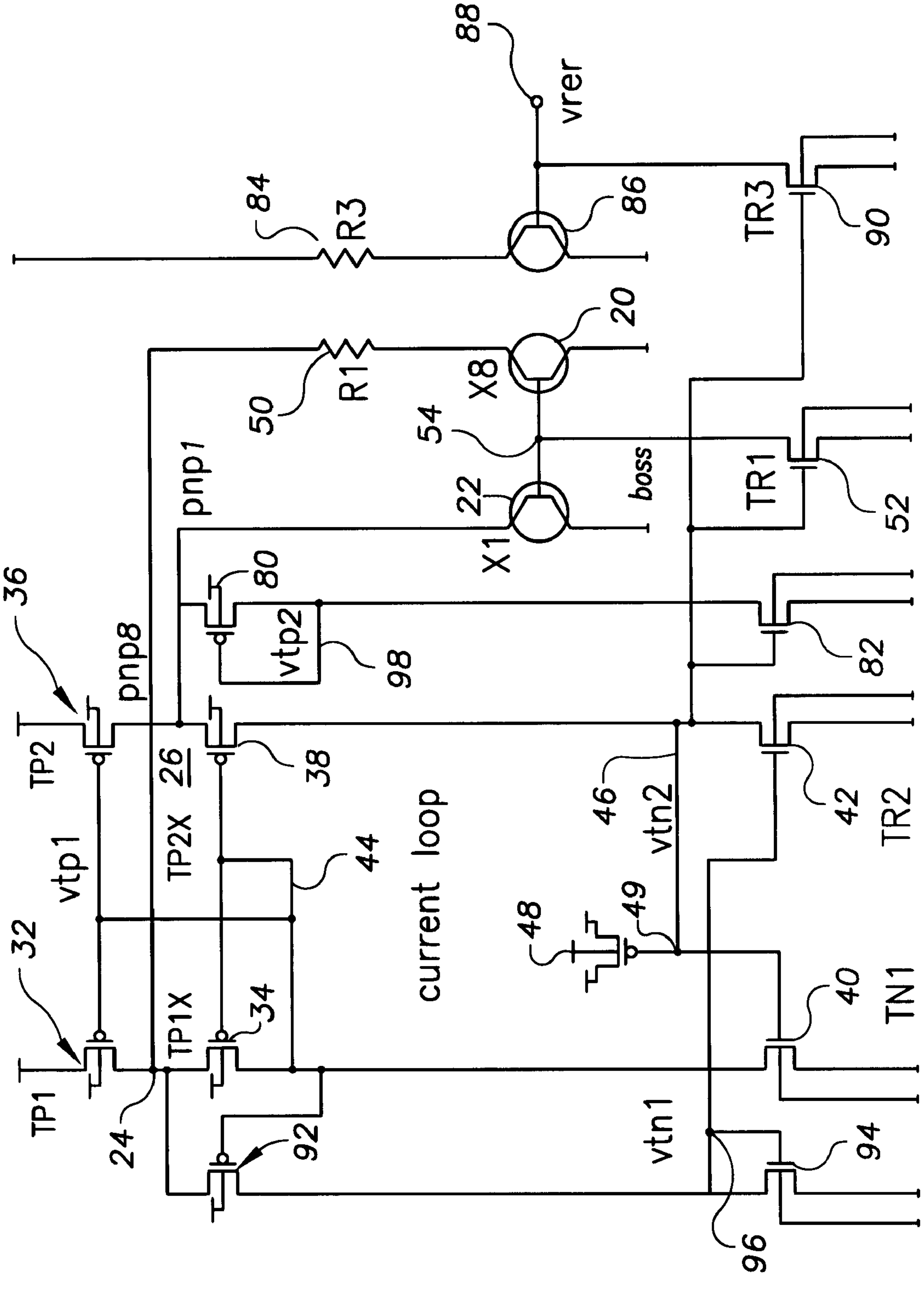
FIG. 3 is a diagram of another PTAT current source circuit including a bandgap reference voltage, according to an example embodiment of the present invention.

FIG. 3 is a diagram of another PTAT current source circuit including a bandgap reference voltage, according to another example embodiment of the present invention. The circuit shown is a modification of the current source circuit of FIG. 1, and maintains several of the reference numbers used therein. FIG. 3 also includes a bandgap reference 88 provided via a first parallel circuit including a transistor 90 used in combination with bipolar transistor 86 and resistor 84. The gate of transistor 90 is coupled to node 49 of the current loop and is responsive thereto. PMOS transistors 80 and 92 are coupled to the current loop so as to form additional branch paths for the current passing through transistors 36 and 32, respectively. Feedback loop 98 provides additional feedback for transistor 80 in a manner similar to feedback path 44. Additional NMOS transistors 94 and 82 have gates respectively interconnected with the gates of transistors 42 and 40, and may be similarly matched to each other. PMOS transistor 90 is also preferably matched to transistor 52.

While the present invention has been described with reference to several particular example embodiments, those skilled in the art will recognize that many changes may be made thereto without departing from the spirit and scope of the present invention, which is set forth in the following claims.

What is claimed is:

1. A PTAT current sourcing circuit, comprising:

a first current path including a pair of cascoded MOS-type transistors inter-coupled at a first node, and including another MOS-type circuit in series with the pair of cascoded MOS-type transistors;

a second current path in parallel with the first current path, the second current path including a pair of cascoded MOS-type transistors inter-coupled at a second node, and including another MOS-type circuit in series with the pair of cascoded MOS-type transistors in the second current path;

the first and second current paths adapted to include feedback and to form a current loop;

first and second bipolar transistors, each respectively drawing current from the first and second current paths at the first and second nodes, and the first bipolar transistor drawing the current through a resistive path adapted to subtract current from the first current path.

2. The PTAT current sourcing circuit of claim 1, wherein the first and second current paths are further adapted with their respective other MOS-type circuits intercoupled to provide a common variable reference voltage.

3. The PTAT current sourcing circuit of claim 2, wherein the common variable reference voltage is coupled to provide a reference voltage to each of the first and second bipolar transistors.

4. The PTAT current sourcing circuit of claim 3, wherein each of the first and second bipolar transistors includes a commonly-connected base node having a voltage that tracks the common variable reference voltage.

5. The PTAT current sourcing circuit of claim 4, wherein the commonly-connected base node of the first and second bipolar transistors is coupled to the common variable reference voltage by an isolation circuit.

6. The PTAT current sourcing circuit of claim 5, wherein each of the first and second current paths is adapted to include feedback by coupling current back to a gate of one of the MOS-type transistors.

7. The PTAT current sourcing circuit of claim 1, wherein the first current path is adapted to include feedback by coupling current from a node between its pair of cascoded MOS-type transistors and its MOS-type circuit to a gate of one of its pair of cascoded MOS-type transistors, and the second current path is adapted to include feedback by coupling current from a node between its pair of cascoded MOS-type transistors and its MOS-type transistor to a gate of its MOS-type circuit.

8. The PTAT current sourcing circuit of claim 6, wherein the respective pairs of cascoded MOS-type transistors of the first and second current paths have their respective gates connected at a common node.

9. The PTAT current sourcing circuit of claim 1, wherein the respective pairs of cascoded MOS-type transistors of the first and second current paths have their respective gates connected at a common node.

10. The PTAT current sourcing circuit of claim 1, wherein at least one of the cascoded MOS-type transistors of the first current path is matched to at least one of the cascoded MOS-type transistors of the second current path, and the other MOS-type circuit of the first current path is matched to the other MOS-type circuit of the second current path.

11. A PTAT current sourcing circuit, comprising:

a first current path including a pair of cascoded MOS-type transistors inter-coupled at a first node, and including another MOS-type circuit in series with the pair of cascoded MOS-type transistors;

a second current path in parallel with the first current path, the second current path including a pair of cascoded MOS-type transistors inter-coupled at a second node, and including another MOS-type circuit in series with the pair of cascoded MOS-type transistors in the second current path;

the first and second current paths adapted to include feedback and to form a current loop;

first and second bipolar transistors, each respectively drawing current from the first and second current paths at the first and second nodes, and the first bipolar transistor drawing the current through a resistive circuit adapted to subtract current from the first current path; and a MOS-type circuit arrangement coupled to the pairs of cascoded MOS-type transistors and adapted to provide a mirrored current source that mirrors the current flow through the resistive circuit.

12. The PTAT current sourcing circuit of claim 11, wherein the first current path is adapted to include feedback by coupling current from a node between its pair of cascoded MOS-type transistors and its MOS-type circuit to a gate of one of its pair of cascoded MOS-type transistors, and the second current path is adapted to include feedback by coupling current from a node between its pair of cascoded MOS-type transistors and its MOS-type transistor to a gate of its MOS-type circuit.

13. The PTAT current sourcing circuit of claim 11, wherein the MOS-type circuit arrangement is connected to each of the nodes providing feedback.

14. The PTAT current sourcing circuit of claim 13, wherein the first and second current paths are further adapted with their respective other MOS-type circuits inter-coupled to provide a common variable reference voltage coupled to the resistive circuit.

15. The PTAT current sourcing circuit of claim 14, wherein the first and second current paths are further adapted with their respective other MOS-type circuits inter-coupled at the node at which feedback from the second current path is provided.

16. The PTAT current sourcing circuit of claim 15, wherein the first and second current paths are further adapted with their respective other MOS-type circuits inter-coupled at the node to which the MOS-type circuit arrangement is coupled.

17. The PTAT current sourcing circuit of claim 13, wherein the first and second current paths are further adapted with their respective other MOS-type circuits inter-coupled at the node at which feedback from the second current path is provided.

18. The PTAT current sourcing circuit of claim 13, wherein the first and second current paths are further adapted with their respective other MOS-type circuits inter-coupled at the node to which the MOS-type circuit arrangement is coupled.

19. A PTAT current sourcing circuit, comprising:

a first current path including first means for providing a current-driving first node that is MOS-isolated from voltage variations, and including another MOS-type circuit in series with the first means;

a second current path in parallel with the first current path, the second current path including second means for providing a current-driving second node that is MOS-isolated from voltage variations, and including another MOS-type circuit in series with the second means;

the first and second current paths adapted to include feedback and to form a current loop;

first and second bipolar transistors, each respectively drawing current from the first and second current paths at the first and second nodes, and the first bipolar transistor drawing the current through a resistive circuit adapted to subtract current from the first current path.

20. A PTAT current sourcing circuit, comprising:

a first current path including first means for providing a current-driving first node that is MOS-isolated from voltage variations, and including another MOS-type circuit in series with the first means;

a second current path in parallel with the first current path, the second current path including second means for providing a current-driving second node that is MOS-isolated from voltage variations, and including another MOS-type circuit in series with the second means;

the first and second current paths adapted to include feedback and to form a current loop;

first and second bipolar transistors, each respectively drawing current from the first and second current paths at the first and second nodes, and the first bipolar transistor drawing the current through a resistive circuit adapted to subtract current from the first current path;

a reference node coupled to each of the other MOS-type circuits of the respective first and second paths and coupled to the respective bases of the first and second bipolar transistors;

another bipolar-type circuit arrangement coupled to the reference node and adapted to draw current from a supply voltage and through another resistive circuit, the other bipolar-type circuit arrangement being adapted to provide a reference voltage that is controlled by the feedback of the first and second current paths.

* * * * *